(12) United States Patent
Lee et al.

(10) Patent No.: US 7,795,800 B2
(45) Date of Patent: Sep. 14, 2010

(54) ORGANIC ELECTRO LUMINESCENCE DEVICE AND FABRICATION METHOD THEREOF

(75) Inventors: Jae Yoon Lee, Seoul (KR); Kwan Soo Kim, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 237 days.

(21) Appl. No.: 10/876,630

(22) Filed: Jun. 28, 2004

(65) Prior Publication Data

US 2005/0140274 A1 Jun. 30, 2005

(30) Foreign Application Priority Data

Dec. 30, 2003 (KR) .................. 10-2003-0100631

(51) Int. Cl.
*H01J 1/62* (2006.01)
*H01J 63/04* (2006.01)

(52) U.S. Cl. ................ 313/504; 313/483; 313/505; 313/506

(58) Field of Classification Search ................ None
See application file for complete search history.

(56) References Cited

U.S. PATENT DOCUMENTS

| | | | | |
|---|---|---|---|---|
| 6,429,584 B2 * | 8/2002 | Kubota | | 313/504 |
| 6,559,594 B2 * | 5/2003 | Fukunaga et al. | | 313/506 |
| 6,737,799 B1 * | 5/2004 | Lih et al. | | 313/498 |
| 6,833,156 B2 * | 12/2004 | Miyashita et al. | | 427/66 |
| 6,838,192 B2 * | 1/2005 | Miyashita et al. | | 428/690 |
| 6,843,937 B1 * | 1/2005 | Kiguchi et al. | | 252/301.16 |
| 7,242,375 B2 * | 7/2007 | Hayashi et al. | | 313/512 |
| 2001/0054868 A1 * | 12/2001 | Okuyama et al. | | 313/504 |
| 2002/0064966 A1 * | 5/2002 | Seki et al. | | 438/780 |
| 2003/0122495 A1 * | 7/2003 | Nakanishi | | 315/169.3 |
| 2003/0142043 A1 * | 7/2003 | Matsueda | | 345/30 |
| 2005/0236620 A1 * | 10/2005 | Yamada | | 257/59 |
| 2005/0236956 A1 * | 10/2005 | Chung et al. | | 313/463 |

FOREIGN PATENT DOCUMENTS

| | | |
|---|---|---|
| CN | 1356857 | 7/2007 |
| KR | 2002-41301 A | 6/2002 |

* cited by examiner

*Primary Examiner*—Nimeshkumar D. Patel
*Assistant Examiner*—Natalie K Walford
(74) *Attorney, Agent, or Firm*—McKenna Long & Aldridge LLP

(57) ABSTRACT

Disclosed is an organic electro luminescence device having a display area having a plurality of display pixels, a dummy area having a plurality of dummy pixels at a periphery of the display area, an anode at display area, a buffer layer on the anode and on the substrate, a barrier on the buffer layer, and an organic electro luminescence layer in the display and dummy pixels.

16 Claims, 5 Drawing Sheets

ORGANIC ELECTRO LUMINESCENCE DEVICE AND FABRICATION METHOD THEREOF

This application claims the benefit of Korean Patent Application No. 2003-100631, filed on Dec. 30, 2003, which is hereby incorporated by reference for all purposes as if fully set forth herein.

BACKGROUND OF THE INVENTION

1. Field of the Invention

The present invention relates to an organic electro luminescence device and a method of fabrication thereof.

2. Discussion of the Related Art

As large-size display devices are in demand, flat panel display (FPD) devices, which occupy less space than conventional displays, are increasingly required. Until now, liquid crystal display (LCD) devices are most highlighted due to their low-power consumption and light weight. However, since the LCD devices are a light receiving device, not a light emitting device, and have disadvantages in brightness, contrast, viewing angle, large-size area and the like, a new flat panel display device is being actively developed in order to overcome such disadvantages of the LCD devices.

One type of the flat panel display devices, organic electro luminescence (OEL) devices are being rapidly developed, and several finished products have been already delivered to the market. Since the organic electro luminescence devices are a self-luminescence type, they have excellent viewing angle, contrast and the like in comparison with the LCD devices. Because the organic electro luminescence devices do not need a backlight assembly, they are lightweight and slim, and have low power consumption. Additionally, since the organic electro luminescence devices can operate at a direct-current low voltage and at a high response speed, and are comprised of solid materials in all, they have high resistance to an external impact, a wide operational temperature range, and especially low manufacturing cost. Furthermore, a manufacturing method of the organic electro luminescence devices is very simple, since all it needs is deposition and encapsulation units, unlike the LCD devices or plasma display panels (PDP).

In the meantime, the organic electro luminescence devices are mainly driven in a passive matrix way without using a switching device such as a thin film transistor. The passive matrix OEL devices are configured in a matrix form where scan lines and signal lines intersect with each other. However, the passive matrix OEL devices have many limitations in resolution, power consumption, life expectancy and the like. Accordingly, active matrix OEL devices, which have switching devices, are being studied and developed as a next generation display requiring a high resolution or a large-size screen. In general, the active matrix OEL devices have a thin film transistor in every pixel to switch each of the pixels. The thin film transistor serves as a switch to turn on/off the pixels, each of which has first and second electrodes facing each other, with the second electrode being used as a common electrode.

When an organic electro luminescence (OEL) layer is formed at a luminescence area of an active matrix OEL device according to a related art, an exposure portion of an insulating film is provided to form the organic electro luminescence layer area in every pixel. However, a new approach to forming an OEL layer for an OEL device has been recently introduced in which an ink-type organic electro luminescence material is directly dispensed in every luminescence area by an inkjet printing method. This inject printing method is simple and can reduce manufacturing cost, as compared with the other known methods. Furthermore, as the resolution of OEL devices becomes higher, which means an interval between pixels becomes smaller, a pixel structure with a barrier is proposed in which the barrier is mainly used for preventing ink-type OEL material dispensed at a luminescence area from being diffused into a non-luminescence area. This barrier also stabilizes the ink-type OEL material dispensed at a luminescence area and is used for patterning a cathode in a subsequent process.

FIG. 1 is a schematic plan view illustrating the panel of an organic electro luminescence device according to a related art, FIG. 2 is a schematic sectional view taken along the line A-A' in FIG. 1, illustrating a pixel at a center portion of the panel in FIG. 1, and FIG. 3 is a schematic sectional view taken along the line B-B' in FIG. 1, illustrating a pixel at an edge portion of the panel in FIG. 1.

As shown in FIG. 1, the related-art organic electro luminescence device includes a plurality of pixels 111 in a display area 101. Each of the pixels 111 emits or does not emit light by a switching function of a thin film transistor (not shown). Additionally, reference numeral 122 denotes a barrier provided between the pixels 111. Further, as shown FIGS. 2 and 3, the related-art organic electro luminescence device includes an anode 201 formed of a transparent conductive material on a substrate 200, and a buffer layer 202 formed on the anode 201. Additionally, a barrier 203 is formed on the buffer layer 202 with a predetermined height. An organic electro luminescence layer 205 is formed in each of the pixels. Each of the pixels 111 has a bank structure with the barrier 122 and 203. The barrier 122 and 203 prevents an organic electro luminescence material from being diffused from a pixel area to a non-pixel area. The organic electro luminescence material is coated by an inkjet method at the pixel areas.

When the organic electro luminescence material is coated by an inkjet method, droplets containing the organic electro luminescence material are instantaneously volatilized due to their strong volatility such that the organic electro luminescence material is coated and dried in the pixels. At this time, a center portion of the display area at which many pixels are arranged have a high concentration of the volatile solvent molecules of the droplets, while an edge portion has a low concentration of the volatile solvent molecules of the droplets. Accordingly, the concentration of the solvent molecules varies depending on the location of the display area. Such a concentration difference causes the solvent molecules to diffuse from a center portion having a high concentration to an edge portion having a low concentration. Due to such a diffusion phenomenon, the organic electro luminescence layer in the pixels at the edge portion of the display area has a non-uniform shape, when it dries, as shown in FIG. 3.

Accordingly, as shown in FIG. 2, the organic electro luminescence layer at a center portion of the display area dries uniformly. However, as shown in FIG. 3, the organic electro luminescence layer at an edge portion of the display area dries unevenly due to a concentration difference of the solvent molecules. The unevenness of the organic electro luminescence layer causes luminance irregularity, leading to display failure and product failure.

SUMMARY OF THE INVENTION

Accordingly, the present invention is directed to an organic electro luminescence device and a fabrication method thereof that substantially obviate one or more problems due to limitations and disadvantages of the related art.

An advantage of the present invention is to provide an organic electro luminescence device and a fabrication method thereof in which when an organic electro luminescence layer is formed in a display area by an inkjet printing method, the organic electro luminescence layer has a uniform thickness irrespective of a position of the organic electro luminescence layer in the display area, which results in a uniform luminance and a good quality of picture.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electro luminescence device includes a display area and a dummy area, the display area having a plurality of display pixels for displaying an image, and the dummy area having a plurality of dummy pixels and being provided at a periphery of the display area, an anode at the display area on a substrate; a buffer layer on the anode of the display area and on the substrate of the dummy area; a barrier on the buffer layer for partitioning the display pixels and the dummy pixels on the substrate and; an organic electro luminescence layer in the display and dummy pixels.

In another aspect of the present invention, a method of fabricating an organic electro luminescence device having a display area and a dummy area, the display area having a plurality of display pixels for displaying an image, and the dummy area having a plurality of dummy pixels and being provided at a periphery of the display area, the method includes forming an anode at the display area on a substrate; forming a buffer layer on the anode of the display area and on the substrate of the dummy area; forming a barrier on the buffer layer for partitioning the display pixels and the dummy pixels; forming an organic electro luminescence layer in the display pixels and the dummy pixels; and forming a cathode on the organic electro luminescence layer.

In still another aspect of the present invention, an organic electro luminescence (OEL) device includes a display area having a plurality of display pixels; a dummy area at a periphery of the display area, the dummy area having a plurality of dummy pixels; and an organic electro luminescence (OEL) layer in the display pixels and the dummy pixels, wherein the dummy pixels do not contribute to displaying images.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings. Wherever possible, the same reference numbers will be used throughout the drawings to refer to the same or like parts.

Figure 1:
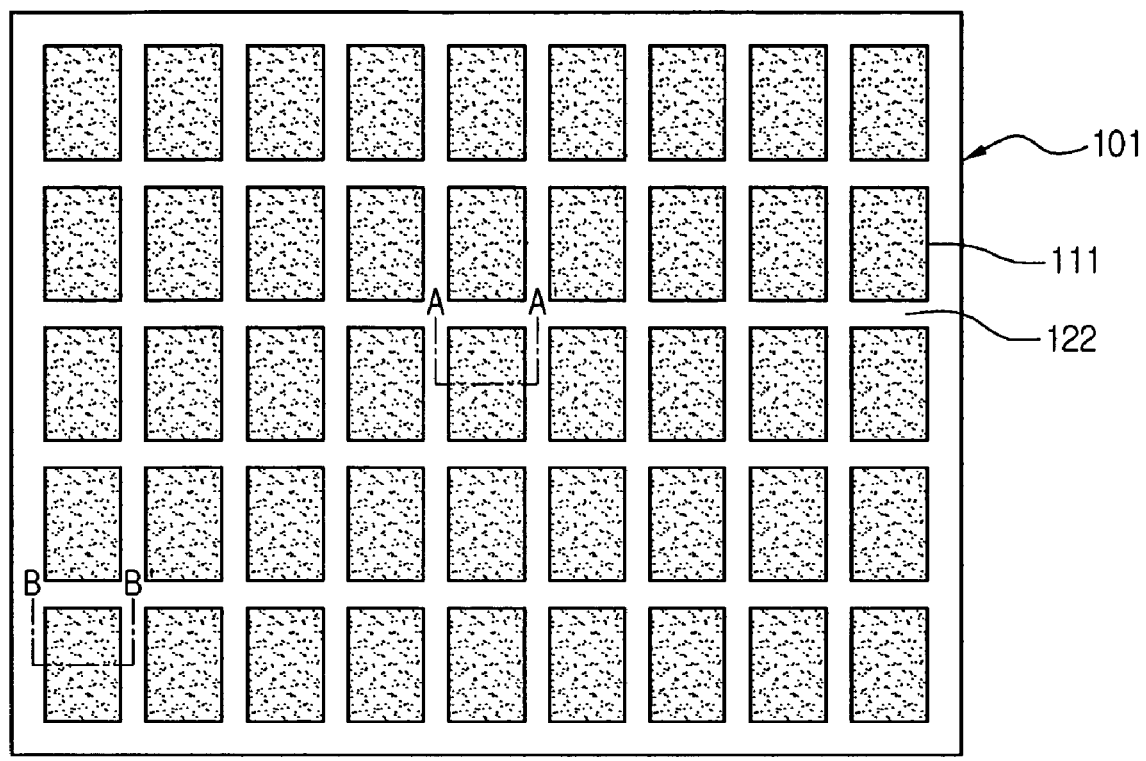
FIG. 1 is a schematic plan view illustrating a panel of a related-art organic electro luminescence device.
Figure 2:
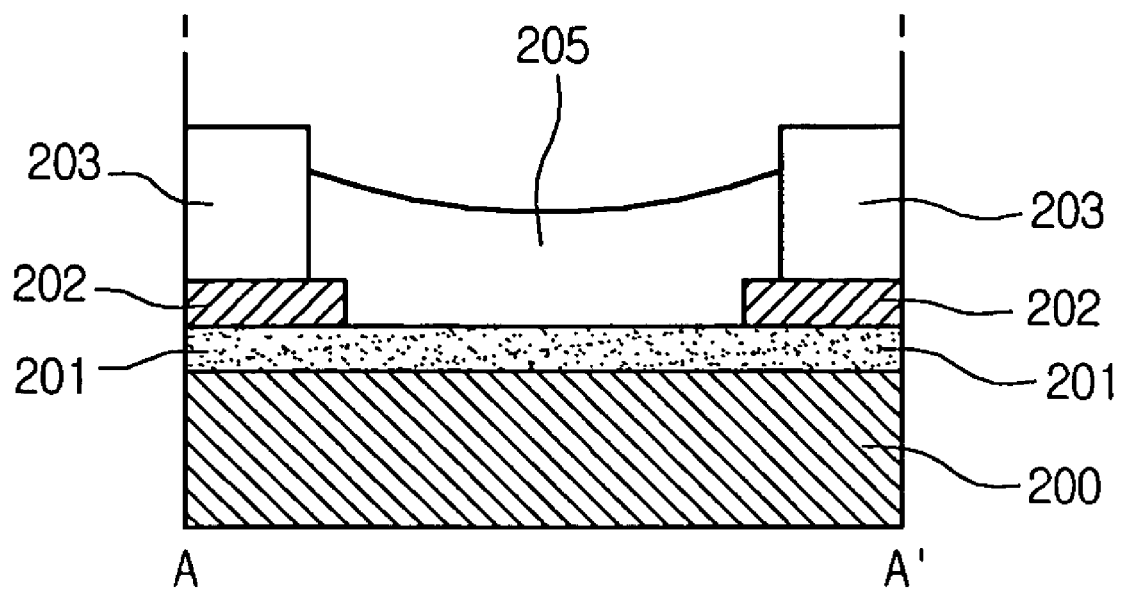
FIG. 2 is a schematic sectional view taken along the line A-A' in FIG. 1, illustrating a pixel at a center portion of the panel in FIG. 1.
Figure 3:
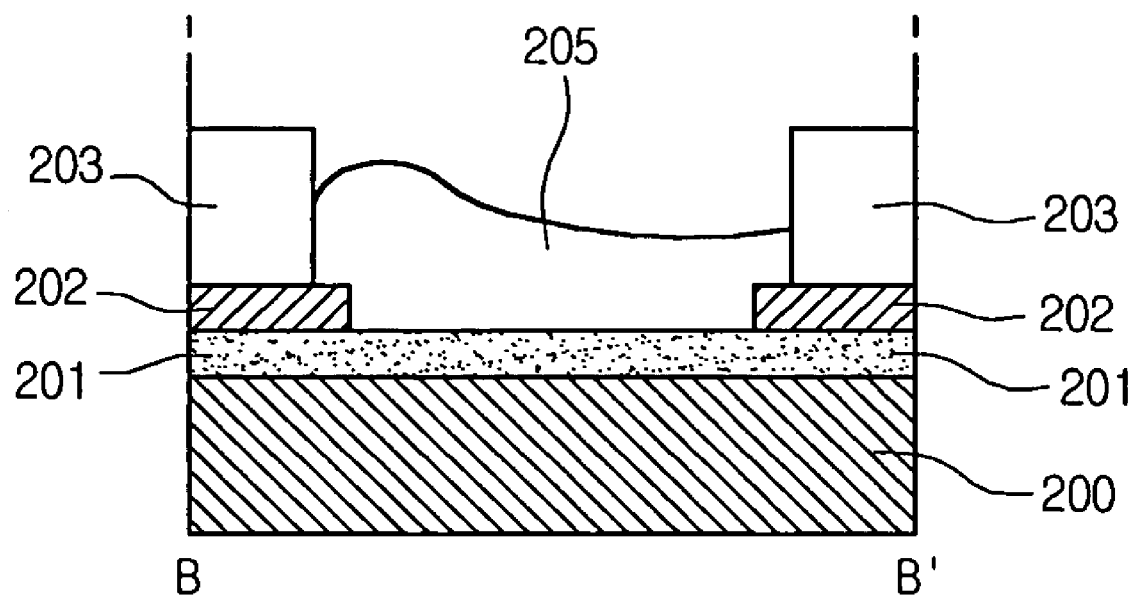
FIG. 3 is a schematic sectional view taken along the line B-B' in FIG. 1, illustrating a pixel at an edge portion of the panel in FIG. 1.
Figure 4:
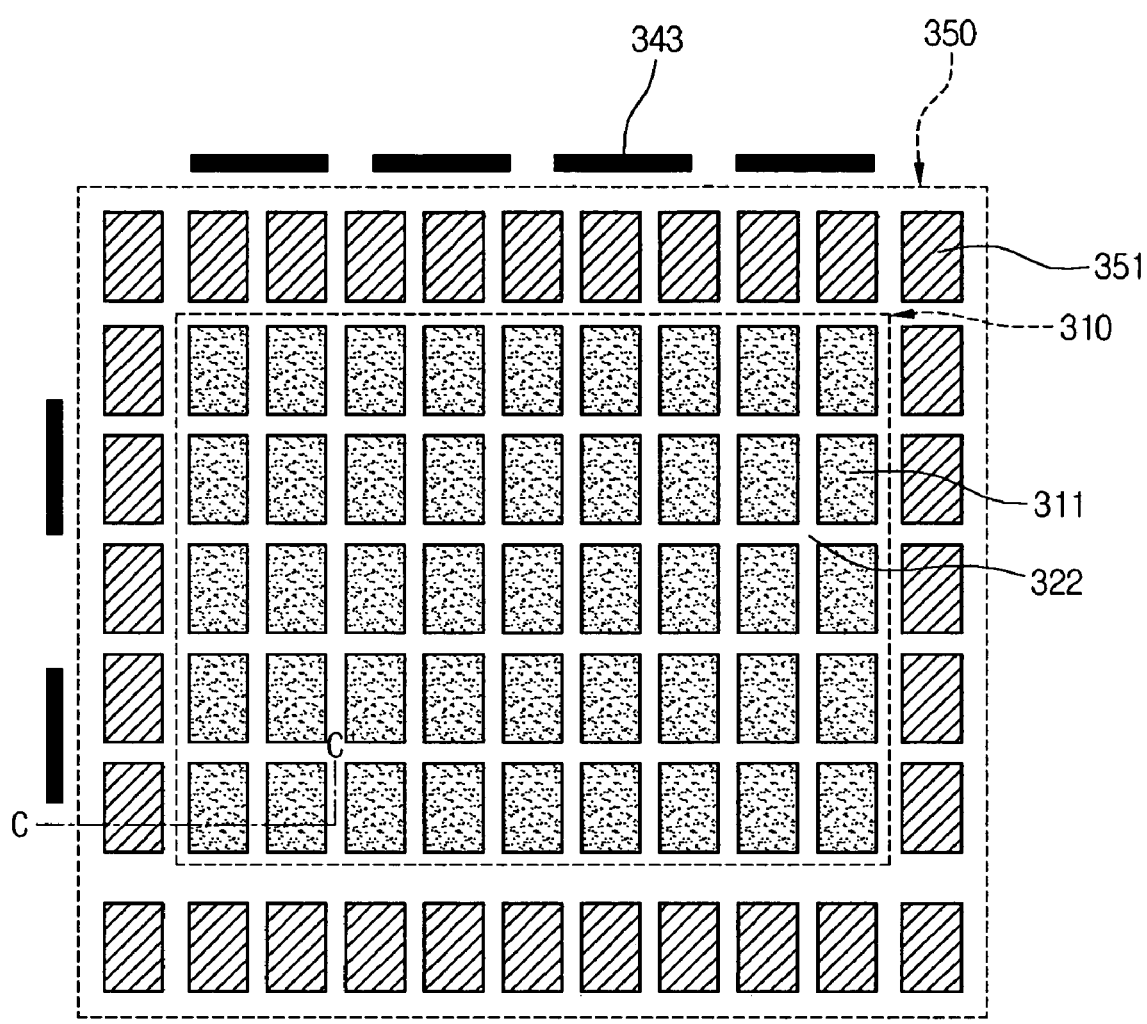
FIG. 4 is a schematic plan view illustrating a panel of an organic electro luminescence device according to an embodiment of the present invention.

FIG. 4 is a schematic plan view illustrating a panel of an organic electro luminescence device according to an embodiment of the present invention.

As shown in FIG. 4, the organic electro luminescence device according to the present invention includes a display area 310 having a plurality of display pixels 311 and a dummy area 350 having a plurality of dummy pixels 351 and formed at a periphery of the display area 310.

Each of the display pixels 311 and the dummy pixels 351 has a bank structure with a barrier 322. The barrier 322 prevents an organic electro luminescence material from being diffused from a luminescence area to a non-luminescence area. The organic electro luminescence material is formed by an inkjet method at the luminescence area. The dummy area 350 is disposed between the display area 310 of the organic electro luminescence device and a lead portion 343. Each of the dummy pixels 351 is formed to have the same shape and pitch as the display pixel 311.

When the organic electro luminescence material is coated or formed by an inkjet method in the display pixels 311 at the display area and the dummy pixels 351 at a periphery of the display area 310, a concentration of the solvent molecules in the organic electro luminescence material is substantially uniform throughout the entire display area 310. The solvent molecules volatilize while the organic electro luminescence material dries. This effect is obtained when the dummy pixels 351 are formed at a periphery of the display area 310 that have the same shape and pitch as the display pixels 311. Since the solvent molecules in the display pixels at an edge portion of the display area 310 have substantially the same concentration as the solvent molecules in the display pixels at a center portion of the display area 310, the organic electro luminescence material coated in each of the display pixels 311 dries to have a substantially same shape. Accordingly, the organic electro luminescence layer can have a uniform thickness in each of the display pixels. Therefore, the OEL device according to the present invention can display images without luminance irregularity and color irregularity at the display area 310.

Figure 5:
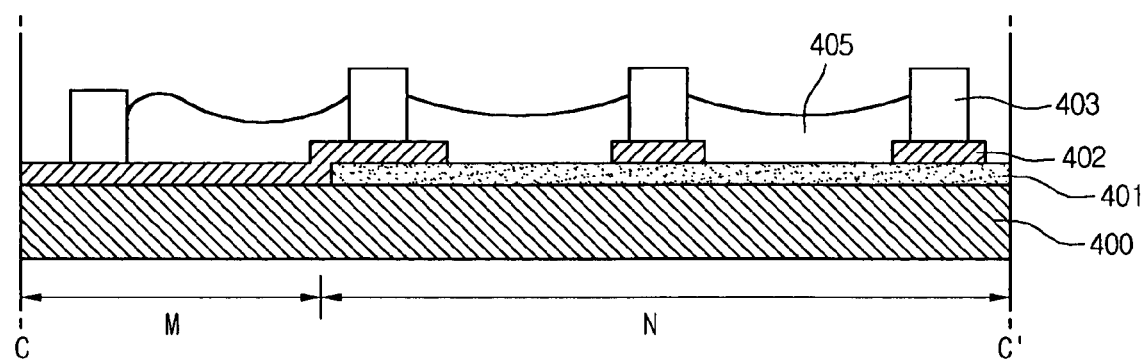
FIG. 5 is a sectional view taken along the line C-C' in FIG. 4.

FIG. 5 is a sectional view taken along the line C-C' in FIG. 4.

As shown in FIG. 5, the organic electro luminescence device according to an embodiment of the present invention has an anode 401 formed as a lower electrode at the display area (N) on a substrate 400. The anode 401 is formed of a conducive material having a high work function. Here, the conducive material is transparent for a bottom luminescence mode. The transparent conducive material is, for example, Indium-Tin-Oxide (ITO), Indium-Zinc-Oxide (IZO), or Indium-Tin-Zinc-Oxide (ITZO).

Additionally, a buffer layer 402 is patterned and formed at the display area (N), and the buffer layer 402 is formed over an entire dummy area (M). A barrier 403 is formed on the buffer layer 402 at the display area (N) to form a bank in every pixel. Here, the barrier 403 prevents the organic electro luminescence materials from being mixed with one another in each of the pixels. Further, the barrier 403 is also formed on the buffer layer 402 at the dummy area to have the same shape and pitch of the barrier at the display area. Here, the barrier 403 is provided to form the dummy pixels at the dummy area (M), which is disposed at an exterior of the display area (N).

Additionally, the organic electro luminescence material is injected into each of the pixels, which are partitioned by the barrier 403, to form the display pixels 311 and the dummy pixels 351. As shown in FIG. 5, the organic electro luminescence material is injected into the dummy pixels 351 of the dummy area (M), but the anode 401 is not provided at the dummy area. Accordingly, when signals are applied to the OEL device to display images, the dummy pixels 351 at the dummy area (M) do not contribute to displaying images.

At this time, since a concentration of the solvent molecules in the organic electro luminescence material is substantially uniform throughout the display area, the organic electro luminescence layer 405 has a substantially uniform thickness after the solvent molecules evaporate.

Additionally, a metal (Ca, Li, Al:Li, Mg:Ag or the like) (not shown) having a low work function is deposited on the organic electro luminescence layer 405 as a cathode, thereby completing the organic electro luminescence device to have a structure in which a thin organic layer is formed between the anode and the cathode.

When a forward bias voltage is applied to the organic electro luminescence device, holes and electrons are injected into the OEL layer from the anode and the cathode, respectively, and the injected holes and electrons combine to form excitons. Additionally, the excitons are radiatively recombined. Pictures with a good quality are displayed through the display pixels, each of which has an OEL layer with a uniform thickness due to the existence of the dummy pixels at an periphery of the OEL device.

According to the present invention, the organic electro luminescence material is coated or formed in each of the pixels on the substrate by an inkjet method. The present invention is advantageous in that the organic electro luminescence material dries to have a substantially uniform thickness due to the existence of the dummy area provided at a periphery of the display area, thereby providing pictures with a good quality and uniform luminance, preventing product failure, and improving product reliability.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electro luminescence device, comprising:
    a display area and a dummy area, the display area having a plurality of display pixels for displaying an image, and the dummy area having a plurality of dummy pixels and being provided at a periphery of the display area;
    an anode integrally formed at two or more of the display pixels of the display area on a substrate, wherein the dummy area has no anode;
    a buffer layer on the anode of the display area and on the substrate of the dummy area, the buffer layer being formed between the display pixels in the display area;
    a barrier on the buffer layer in the display pixels of the display area and the dummy pixels of the dummy area for partitioning the display pixels and the dummy pixels on the substrate, wherein an upper surface of the barrier in the dummy pixels is lower than an upper surface of the barrier in the display pixels;
    an organic electro luminescence layer in the display and dummy pixels; and
    a cathode on the organic electro luminescence layer,
    wherein the dummy pixels have the same shape as the display pixels, and
    wherein the organic electro luminescence layer is partitioned by the barrier in the display area and the dummy area,
    wherein solvent molecules of the organic electro luminescence layer in the display pixels at an edge portion of the display area have substantially the same concentration as solvent molecules of the organic electro luminescence layer in the display pixels at the display area.

2. The device according to claim 1, wherein the anode is formed of any one of ITO (Indium Tin Oxide), IZO (Indium Zinc Oxide) and ITZO (Indium Tin Zinc Oxide).

3. The device according to claim 1, wherein the buffer layer at the display area has a pattern.

4. The device according to claim 1, wherein the buffer layer is formed at an entire dummy area.

5. The device according to claim 1, wherein at least two display pixels are on an anode.

6. A method of fabricating an organic electro luminescence device having a display area and a dummy area, the display area having a plurality of display pixels for displaying an image, and the dummy area having a plurality of dummy pixels and being provided at a periphery of the display area, the display pixels having the same pitch as the dummy pixels, the method comprising:
    forming an anode integrally formed at two or more of the display pixels of the display area without forming the anode at the dummy area on a substrate;
    forming a buffer layer on the anode of the display area and on the substrate of the dummy area, the buffer layer being formed between the display pixels in the display area;
    forming a barrier on the buffer layer in the display pixels of the display area and the dummy pixels of the dummy area for partitioning the display pixels and the dummy pixels;
    forming an organic electro luminescence layer in the display pixels and the dummy pixels; and
    forming a cathode on the organic electro luminescence layer,
    wherein an upper surface of the barrier in the dummy pixels is lower than an upper surface of the barrier in the display pixels,
    wherein the organic electro luminescence layer is formed by an inkjet method,
    wherein the dummy pixels have the same shape as the display pixels, and
    wherein the organic electro luminescence layer is partitioned by the barrier in the display area and the dummy area,
    wherein solvent molecules of the organic electro luminescence layer in the display pixels at an edge portion of the display area have substantially the same concentration as solvent molecules of the organic electro luminescence layer in the display pixels at the display area.

7. The method according to claim 6, wherein the anode is formed of any one of ITO (Indium Tin Oxide), IZO (Indium Zinc Oxide) and ITZO (Indium Tin Zinc Oxide).

8. The method according to claim 6, wherein the buffer layer at the display area has a pattern.

9. The method according to claim 6, wherein the buffer layer is formed at an entire dummy area.

10. The device according to claim 6, wherein at least two display pixels are on an anode.

11. An organic electro luminescence (OEL) device comprising:
a display area having a plurality of display pixels;
a dummy area at a periphery of the display area, the dummy area having a plurality of dummy pixels;
an anode integrally formed at two or more of the display pixels of the display area on a substrate, wherein the dummy area has no anode;
a buffer layer on the anode of the display area and on the substrate of the dummy area, the buffer layer being formed between the display pixels in the display area;
a barrier on the buffer layer in the display pixels of the display area and the dummy pixels of the dummy area for partitioning the display pixels and the dummy pixels;
an organic electro luminescence (OEL) layer in the display pixels and the dummy pixels; and
a cathode on the organic electro luminescence layer,
wherein the dummy pixels do not contribute to displaying images, an upper surface of the barrier in the dummy pixels is lower than an upper surface of the barrier in the display pixels,
wherein the dummy pixels have the same shape as the display pixels, and
wherein the organic electro luminescence layer is partitioned by the barrier in the display area and the dummy area,
wherein solvent molecules of the organic electro luminescence layer in the display pixels at an edge portion of the display area have substantially the same concentration as solvent molecules of the organic electro luminescence layer in the display pixels at the display area.

12. The device according to claim 11, wherein the anode is formed of any one of ITO (Indium Tin Oxide), IZO (Indium Zinc Oxide) and ITZO (Indium Tin Zinc Oxide).

13. The device according to claim 11, wherein the buffer layer at the display area has a pattern.

14. The device according to claim 11, wherein the buffer layer is formed over the entire dummy area.

15. The device according to claim 11, wherein at least two display pixels are on an anode.

16. An organic electro luminescence device, comprising:
a display area and a dummy area, the display area having a plurality of display pixels for displaying an image, and the dummy area having a plurality of dummy pixels and being provided at a periphery of the display area;
an anode integrally formed at two or more of the display pixels of the display area on a substrate, wherein the dummy area has no anode;
a buffer layer on the anode of the display area and on the substrate of the dummy area, the buffer layer being formed between the display pixels in the display area;
an organic electro luminescence layer in the display and dummy pixels, wherein the organic electro luminescence layer includes solvent molecules;
a cathode on the organic electro luminescence layer;
wherein the dummy pixels have the same shape as the display pixels,
wherein the organic electro luminescence layer is partitioned by the barrier in the display area and the dummy area,
wherein the solvent molecules in the display pixels at an edge portion of the display area have substantially the same concentration as the solvent molecules in the display pixels at a center portion of the display area.

* * * * *